(12) United States Patent
Chuang

(10) Patent No.: US 11,984,417 B2
(45) Date of Patent: May 14, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 285 days.

(21) Appl. No.: 17/648,309

(22) Filed: Jan. 19, 2022

(65) Prior Publication Data

US 2023/0005849 A1    Jan. 5, 2023

Related U.S. Application Data

(63) Continuation of application No. PCT/CN2021/117500, filed on Sep. 9, 2021.

(30) Foreign Application Priority Data

Jul. 1, 2021    (CN) .......................... 202110746011.4

(51) Int. Cl.
*H01L 23/48*   (2006.01)
*H01L 23/00*   (2006.01)

(52) U.S. Cl.
CPC .............. *H01L 24/05* (2013.01); *H01L 24/08* (2013.01); *H01L 24/80* (2013.01); *H01L 24/03* (2013.01); *H01L 2224/0331* (2013.01); *H01L 2224/03462* (2013.01); *H01L 2224/05013* (2013.01); *H01L 2224/05017* (2013.01); *H01L 2224/05025* (2013.01); *H01L 2224/05073* (2013.01); *H01L 2224/05147* (2013.01); *H01L 2224/05184* (2013.01); *H01L 2224/05553* (2013.01); *H01L 2224/05564* (2013.01);
(Continued)

(58) Field of Classification Search
CPC ............... H01L 24/03–08; H01L 24/80; H01L 2224/03031–05601; H01L 2224/8081
See application file for complete search history.

(56) References Cited

U.S. PATENT DOCUMENTS 10,790,262 B2    9/2020  Uzoh et al.
10,796,913 B2   10/2020  Lin
(Continued)

FOREIGN PATENT DOCUMENTS

CN    106571334 A    4/2017
CN    111801793 A   10/2020

OTHER PUBLICATIONS

International Search Report cited in PCT/CN2021/117500 dated Mar. 30, 2022, 9 pages.

*Primary Examiner* — Hoa B Trinh
(74) *Attorney, Agent, or Firm* — Cooper Legal Group, LLC

(57) ABSTRACT

The present disclosure relates to the technical field of semiconductors, and provides a semiconductor structure and a manufacturing method thereof. The semiconductor structure includes a first chip and a second chip. A first conductive connection wire of the first chip is connected to a first conductive contact pad, and a second conductive connection wire of the second chip is connected to a second conductive contact pad. In addition, the first conductive contact pad includes a first conductor group and a second conductor group, and the second conductive contact pad includes a third conductor group and a fourth conductor group.

20 Claims, 5 Drawing Sheets

(52) U.S. Cl.
CPC .............. *H01L 2224/05578* (2013.01); *H01L 2224/05601* (2013.01); *H01L 2224/05609* (2013.01); *H01L 2224/05611* (2013.01); *H01L 2224/05613* (2013.01); *H01L 2224/05616* (2013.01); *H01L 2224/05638* (2013.01); *H01L 2224/08145* (2013.01); *H01L 2224/08503* (2013.01); *H01L 2224/8081* (2013.01)

(56) References Cited

U.S. PATENT DOCUMENTS

| | | |
|---|---|---|
| 2016/0013160 A1 | 1/2016 | Chun et al. |
| 2016/0197049 A1 | 7/2016 | Chen et al. |
| 2018/0269172 A1 | 9/2018 | Katkar et al. |
| 2020/0098711 A1* | 3/2020 | Choi ................ H01L 27/14618 |
| 2021/0375790 A1* | 12/2021 | Oda ....................... H01L 24/80 |

* cited by examiner

SEMICONDUCTOR STRUCTURE AND MANUFACTURING METHOD THEREOF

CROSS-REFERENCE TO RELATED APPLICATIONS

This is a continuation of International Patent Application No. PCT/CN2021/117500, filed on Sep. 9, 2021, which claims the priority to Chinese Patent Application No. 202110746011.4, titled "SEMICONDUCTOR STRUCTURE AND MANUFACTURING METHOD THEREOF and filed on Jul. 1, 2021. The entire contents of" International Patent Application No. PCT/CN2021/117500 and Chinese Patent Application No. 202110746011.4 are incorporated herein by reference.

TECHNICAL FIELD

The present disclosure relates to the technical field of semiconductors, and in particular to a semiconductor structure and a manufacturing method thereof.

BACKGROUND

In the related art, chips are bonded through interconnection of metal pads on the chips. The stacked chips need to be transferred before further bonding. If there is vibration or an external force, the stacked chips cannot be aligned due to slippage, which may increase the manufacturing difficulty.

SUMMARY

The present disclosure provides a semiconductor structure and a manufacturing method thereof, to improve the performance of the semiconductor structure.

According to a first aspect, the present disclosure provides a semiconductor structure, including:

a first chip, where the first chip includes a first substrate, a first conductive connection wire and a first conductive contact pad, the first conductive contact pad is connected to the first conductive connection wire, the first conductive contact pad includes a first conductor group and a second conductor group, and a melting point of the first conductor group is higher than a melting point of the second conductor group; and a second chip, where the second chip includes a second substrate, a second conductive connection wire and a second conductive contact pad, the second conductive contact pad is connected to the second conductive connection wire, the second conductive contact pad includes a third conductor group and a fourth conductor group, a melting point of the third conductor group is higher than a melting point of the fourth conductor group, the first conductor group is directly opposite to the third conductor group, and the second conductor group is directly opposite to the fourth conductor group, such that a bonding structure is formed between the first conductive contact pad and the second conductive contact pad;

where an end of the first conductive contact pad facing toward the second conductive contact pad is a first contact surface, an end of the second conductive contact pad facing toward the first contact surface is a second contact surface, an area occupied by the first conductor group on the first contact surface is smaller than an area occupied by the second conductor group on the first contact surface, and an area occupied by the third conductor group on the second contact surface is smaller than an area occupied by the fourth conductor group on the second contact surface.

According to a second aspect, the present disclosure provides a method of manufacturing a semiconductor structure, including:

providing a first chip, where the first chip includes a first substrate, a first conductive connection wire and a first conductive contact pad, the first conductive contact pad is connected to the first conductive connection wire, the first conductive contact pad includes a first conductor group and a second conductor group, and a melting point of the first conductor group is higher than a melting point of the second conductor group;

providing a second chip, where the second chip includes a second substrate, a second conductive connection wire and a second conductive contact pad, the second conductive contact pad is connected to the second conductive connection wire, the first conductive contact pad includes a third conductor group and a fourth conductor group, and a melting point of the third conductor group is higher than a melting point of the fourth conductor group;

aligning the first chip with the second chip, such that the first conductor group is directly opposite to the third conductor group and the second conductor group is directly opposite to the fourth conductor group; and connecting the first chip and the second chip;

where an end of the first conductive contact pad facing toward the second conductive contact pad is a first contact surface, an end of the second conductive contact pad facing toward the first contact surface is a second contact surface, an area occupied by the first conductor group on the first contact surface is smaller than an area occupied by the second conductor group on the first contact surface, and an area occupied by the third conductor group on the second contact surface is smaller than an area occupied by the fourth conductor group on the second contact surface.

BRIEF DESCRIPTION OF THE DRAWINGS

The preferred embodiments of the present disclosure are described in detail below with reference to the accompanying drawings to make the objectives, features and advantages of the present disclosure more obvious. The drawings are merely exemplary illustrations of the present disclosure, and are not necessarily drawn to scale. The same reference numerals in the drawings always represent the same parts. In the drawings.

DETAILED DESCRIPTION

Figure 1:
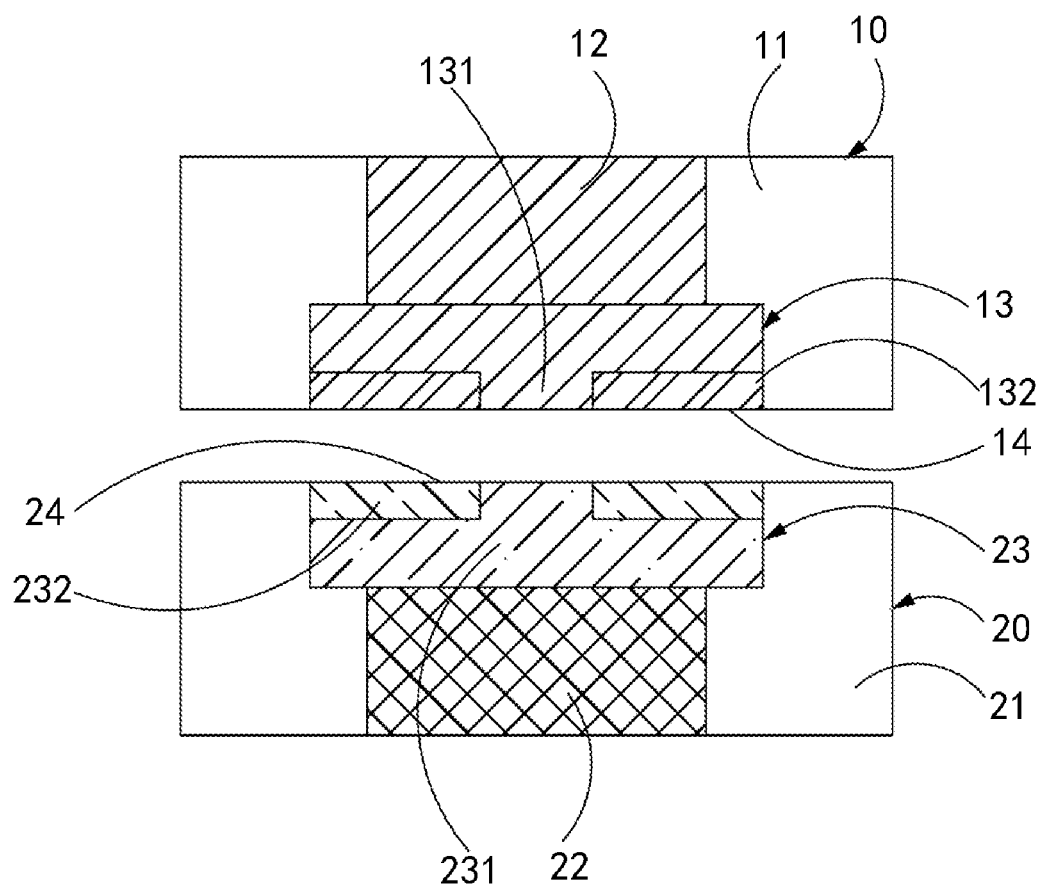
FIG. 1 is a schematic structural diagram illustrating decomposition of a first chip and a second chip of a semiconductor structure according to an exemplary implementation.

The typical embodiments embodying the features and advantages of the present disclosure are described in detail below. It should be understood that the present disclosure may have various changes in different embodiments, which do not depart from the scope of the present disclosure. The description and drawings herein are essentially used for the purpose of explanation, rather than limiting the present disclosure.

Different exemplary embodiments of the present disclosure are described below with reference to the accompanying drawings. The accompanying drawings form a part of the present disclosure, which show by way of example different exemplary structures, systems and steps that can implement various aspects of the present disclosure. It should be understood that other specific solutions of components, structures, exemplary devices, systems and steps may be used, and structural and functional modifications may be made without departing from the scope of the present disclosure. Moreover, although the terms such as "above", "between" and "within" may be used in this specification to describe different exemplary features and elements of the present disclosure, these terms are used herein only for convenience of description, for example, according to the directions of the examples in the drawings. Nothing in this specification should be understood as requiring a specific three-dimensional direction of the structure to fall within the scope of the present disclosure.

Figure 2:
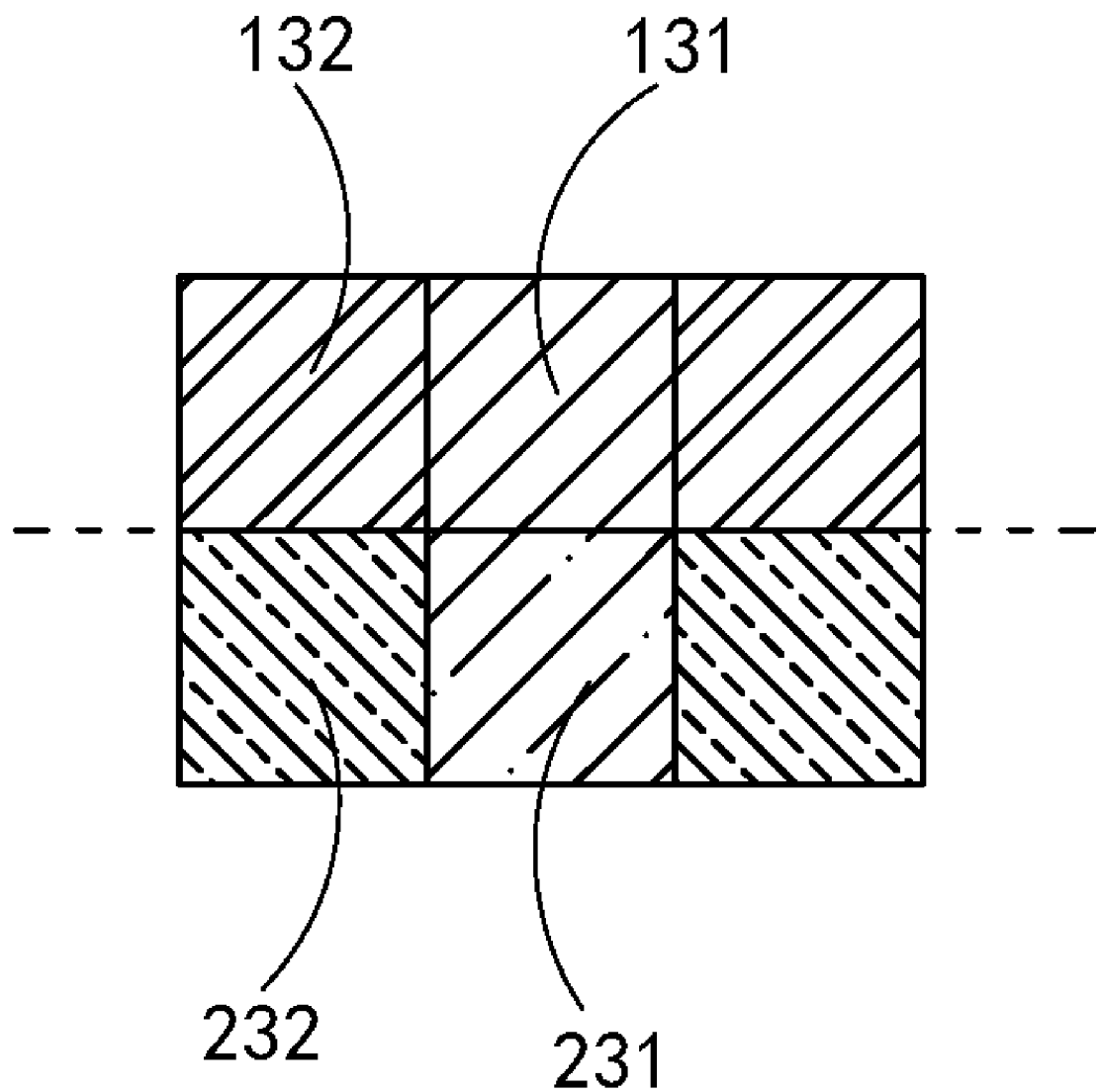
FIG. 2 is a schematic structural diagram illustrating local connection of a first chip and a second chip of a semiconductor structure according to an exemplary implementation.

An embodiment of the present disclosure provides a semiconductor structure. With reference to FIGS. 1 and 2, the semiconductor structure includes a first chip 10 and a second chip 20. The first chip 10 includes a first substrate 11, a first conductive connection wire 12 and a first conductive contact pad 13, where the first conductive contact pad 13 is connected to the first conductive connection wire 12 and includes a first conductor group 131 and a second conductor group 132, and a melting point of the first conductor group 131 is higher than that of the second conductor group 132. The second chip 20 includes a second substrate 21, a second conductive connection wire 22 and a second conductive contact pad 23, where the second conductive contact pad 23 is connected to the second conductive connection wire 22 and includes a third conductor group 231 and a fourth conductor group 232, a melting point of the third conductor group 231 is higher than that of the fourth conductor group 232, the first conductor group 131 is directly opposite to the third conductor group 231, and the second conductor group 132 is directly opposite to the fourth conductor group 232. In this way, a bonding structure is formed between the first conductive contact pad 13 and the second conductive contact pad 23. An end of the first conductive contact pad 13 facing toward the second conductive contact pad 23 is a first contact surface 14, and an end of the second conductive contact pad 23 facing toward the first contact surface 14 is a second contact surface 24. In addition, an area occupied by the first conductor group 131 on the first contact surface 14 is smaller than an area occupied by the second conductor group 132 on the first contact surface 14, and an area occupied by the third conductor group 231 on the second contact surface 24 is smaller than an area occupied by the fourth conductor group 232 on the second contact surface 24.

The semiconductor structure according to the embodiment of the present disclosure includes the first chip 10 and the second chip 20. The first conductive connection wire 12 of the first chip 10 is connected to the first conductive contact pad 13, and the second conductive connection wire 22 of the second chip 20 is connected to the second conductive contact pad 23. In addition, the first conductive contact pad 13 includes the first conductor group 131 and the second conductor group 132, and the second conductive contact pad 23 includes the third conductor group 231 and the fourth conductor group 232. The first conductor group 131 is directly opposite to the third conductor group 231, and the second conductor group 132 is directly opposite to the fourth conductor group 232. Moreover, the melting point of the first conductor group 131 is higher than that of the second conductor group 132, and the melting point of the third conductor group 231 is higher than that of the fourth conductor group 232. Therefore, the second conductor group 132 and the fourth conductor group 232 may be melted and connected at a first temperature, that is, pre-connection of the first conductive contact pad 13 and the second conductive contact pad 23 is implemented. Then, the first chip 10 and the second chip 20 that are pre-connected are transferred to an annealing condition at a second temperature for bonding, so as to implement reliable bonding of the first conductive contact pad 13 and the second conductive contact pad 23. Before the transfer, the first chip 10 and the second chip 20 have been pre-connected, such that the first chip 10 and the second chip 20 will not move relatively, thereby ensuring reliable alignment of the first chip 10 and the second chip 20, and improving the performance of the semiconductor structure.

It should be noted that, at the first temperature, the second conductor group 132 and the fourth conductor group 232 are melted, while the first conductor group 131 and the third conductor group 231 are not melted. At the moment, the second conductor group 132 and the fourth conductor group 232 may be connected, and various metal materials of the first conductive contact pad 13 and the second conductive contact pad 23 are interpenetrated and fused, as shown in FIG. 2. Therefore, an intermetallic compound is formed and then the pre-connection of the first conductive contact pad 13 and the second conductive contact pad 23 is implemented. The first conductive contact pad 13 and the second conductive contact pad 23 are pre-connected, such that relative slippage of the first chip 10 and the second chip 20 will not occur in a subsequent process of transferring the first chip 10 and the second chip 20. In this way, it is ensured that the first chip 10 and the second chip 20 may be bonded to each other under the annealing condition at the second temperature after the first chip 10 and the second chip 20 are reliably aligned. Therefore, the reliable bonding of the first conductive contact pad 13 and the second conductive contact pad 23 is implemented, and the reliable bonding structure is formed between the first conductive contact pad 13 and the second conductive contact pad 23. In the related art, the first chip 10 and the second chip 20 are directly placed in a high-temperature environment for bonding. In the transfer process, the alignment is influenced by slippage, which may influence the performance of the semiconductor structure. However, the semiconductor structure in the embodiment can improve an alignment problem in the related art, so as to improve the performance of the semiconductor structure.

The first conductor group 131 is directly opposite to the third conductor group 231 and the second conductor group 132 is directly opposite to the fourth conductor group 232, which actually illustrates a position relationship between the first chip 10 and the second chip 20 before the bonding. After the bonding, that is, when the bonding structure is formed between the first conductive contact pad 13 and the second conductive contact pad 23, there may not always be the position relationship, and a corresponding position relationship may not be determined between conductive materials due to fusion. However, the position relationship may be judged from material configuration.

In some embodiments, both the first conductive connection wire 12 and the first conductive contact pad 13 are located in the first substrate 11, and both the second conductive connection wire 22 and the second conductive contact pad 23 are located in the second substrate 21.

The first conductive connection wire 12 and the first conductive contact pad 13 may be partially or entirely located in the first substrate 11. Correspondingly, the second conductive connection wire 22 and the second conductive contact pad 23 may be partially or entirely located in the second substrate 21.

In some embodiments, the first conductive contact pad 13 may be located on a surface of the first substrate 11. Correspondingly, the second conductive contact pad 23 may be located on a surface of the second substrate 21.

It should be noted that after the first chip 10 and the second chip 20 are bonded, the first substrate 11 and the second substrate 21 are bonded to each other. The first substrate 11 includes a silicon substrate and an insulating layer formed above the silicon substrate, a part of the first conductive connection wire 12 is located in the insulating layer, and the first conductive contact pad 13 is formed in the insulating layer. Correspondingly, the second substrate 21 includes a silicon substrate and an insulating layer formed above the silicon substrate, a part of the second conductive connection wire 22 is located in the insulating layer, and the second conductive contact pad 23 is formed in the insulating layer. When the first chip 10 and the second chip 20 are bonded, the first conductive contact pad 13 and the second conductive contact pad 23 are bonded to each other, and the insulating layers of the first chip 10 and the second chip 20 are bonded to each other.

In some embodiments, the insulating layer of the first chip 10 is adjacent to the second conductor group 132, and the insulating layer of the second chip 20 is adjacent to the fourth conductor group 232. In addition, a coefficient of expansion of the second conductor group 132 is far lower than that of the first conductor group 131, and correspondingly, a coefficient of expansion the fourth conductor group 232 is far lower than that of the third conductor group 231. Therefore, in a process of bonding the first conductive contact pad 13 and the second conductive contact pad 23, expansion of the second conductor group 132 and the fourth conductor group 232 is lower. In this way, the bonded insulating layers of the first chip 10 and the second chip 20 will not be excessively extruded, thereby preventing a problem of forming cracks between the insulating layers. In the related art, copper is directly adjacent to the insulating layers and is prone to spread the peripheral bonded insulating layers to form cracks. However, the embodiment can solve the problem.

Specifically, the silicon substrates may be made of a silicon-containing material. The silicon substrates may be made of any proper material, for example, including at least one of silicon, monocrystalline silicon, polycrystalline silicon, amorphous silicon, silicon-germanium, monocrystalline silicon-germanium, polycrystalline silicon-germanium or carbon-doped silicon.

The insulating layers may include silicon dioxide ($SiO_2$), silicon oxide carbon (SiOC), silicon nitride (SiN), silicon carbon nitride (SiCN), and other related integrated circuit insulating materials.

In an embodiment, the first conductive connection wire 12 is a first through-silicon via, and the second conductive connection wire 22 is a second through-silicon via. The first through-silicon via and the second through-silicon via are connected through the first conductive contact pad 13 and the second conductive contact pad 23.

In an embodiment, a thickness of the second conductor group 132 is less than 1 um, and a thickness of the fourth conductor group 232 is less than 1 um.

As shown in FIG. 1, the end of the first conductive contact pad 13 facing toward the second conductive contact pad 23 is the first contact surface 14, and the end of the second conductive contact pad 23 facing toward the first contact surface 14 is the second contact surface 24. The first conductor group 131 and the second conductor group 132 occupy a part of the first contact surface 14, respectively, and the third conductor group 231 and the fourth conductor group 232 occupy a part of the second contact surface 24, respectively. In addition, the area occupied by the first conductor group 131 on the first contact surface 14 is smaller than the area occupied by the second conductor group 132 on the first contact surface 14, and the area occupied by the third conductor group 231 on the second contact surface 24 is smaller than the area occupied by the fourth conductor group 232 on the second contact surface 24. When the first chip 10 and the second chip 20 are bonded, the first contact surface 14 and the second contact surface 24 are butted to implement electrical connection of the first conductive contact pad 13 and the second conductive contact pad 23.

It should be noted that the first conductor group 131, the second conductor group 132, the third conductor group 231 and the fourth conductor group 232 are all conductors. Therefore, an electrical connection contact surface with a larger area may be formed between the first conductive contact pad 13 and the second conductive contact pad 23. The area occupied by the first conductor group 131 on the first contact surface 14 is smaller than the area occupied by the second conductor group 132 on the first contact surface 14, and the area occupied by the third conductor group 231 on the second contact surface 24 is smaller than the area occupied by the fourth conductor group 232 on the second contact surface 24. That is, the second conductor group 132 and the fourth conductor group 232 are melted at the first temperature, such that a larger pre-connection surface may be formed to ensure the subsequent connection stability.

In some embodiments, the first conductor group 131 and the second conductor group 132 occupy a part of the first contact surface 14, that is, the first conductive contact pad 13 may also include other conductors. Correspondingly, the third conductor group 231 and the fourth conductor group 232 occupy a part of the second contact surface 24, and the second conductive contact pad 23 may also include other conductors. Melting points of the other conductors of the first conductive contact pad 13 and the second conductive contact pad 23 are not limited. The present disclosure focuses on embodying that the first chip 10 and the second chip 20 may be pre-connected at a relatively low temperature by limiting a melting point relationship of the first conductor group 131 and the second conductor group 132 as well as a melting point relationship of the third conductor group 231 and the fourth conductor group 232.

In some embodiments, the first conductor group 131 and the second conductor group 132 occupy the whole first contact surface 14. That is, the first conductive contact pad 13 may only include the first conductor group 131 and the second conductor group 132, or the first conductive contact pad 13 may include other conductors that are not located at an end of the first conductive contact pad 13 away from the first conductive connection wire 12. Correspondingly, the third conductor group 231 and the fourth conductor group 232 occupy the whole second contact surface 24. That is, the second conductive contact pad 23 may only include the third conductor group 231 and the fourth conductor group 232, or the second conductive contact pad 23 may include other conductors that are not located at an end of the second conductive contact pad 23 away from the second conductive connection wire 22.

In an embodiment, the first conductor group 131 may include a plurality of conductive materials, that is, the first conductor group 131 may be made of a plurality of different types of conductive materials. Here, the plurality of types of conductive materials are different from an intermetallic compound, that is, the first conductor group 131 may include a plurality of single metal materials, or a plurality of intermetallic compounds, or the single metal materials and the intermetallic compounds. Correspondingly, reference may be made to the embodiment for the second conductor group 132, the third conductor group 231 and the fourth conductor group 232, and details are not described herein.

In an embodiment, the first conductor group 131 includes only a first conductor, the second conductor group 132 includes only a second conductor, the third conductor group 231 includes only a third conductor, and the fourth conductor group 232 includes only a fourth conductor. That is, the first conductor group 131, the second conductor group 132, the third conductor group 231 and the fourth conductor group 232 are all single metal materials or intermetallic compounds.

In an embodiment, an area of the first contact surface 14 is equal to that of the second contact surface 24, that is, an area of a fusion surface of the first chip 10 is consistent with an area of a fusion surface of the second chip 20. When the first conductor group 131 and the second conductor group 132 occupy the whole first contact surface 14, and the third conductor group 231 and the fourth conductor group 232 occupy the whole second contact surface 24, the area occupied by the first conductor group 131 on the first contact surface 14 is equal to the area occupied by the third conductor group 231 on the second contact surface 24, and the area occupied by the second conductor group 132 on the first contact surface 14 is equal to the area occupied by the fourth conductor group 232 on the second contact surface 24. In this way, it is ensured that the first conductor group 131 is directly opposite to the third conductor group 231 and the second conductor group 132 is directly opposite to the fourth conductor group 232.

In some embodiments, when the area of the first contact surface 14 is equal to that of the second contact surface 24, the first conductor group 131 and the second conductor group 132 occupy a part of the first contact surface 14, and the third conductor group 231 and the fourth conductor group 232 occupy a part of the second contact surface 24, it may be ensured that the first conductor group 131 is directly opposite to the third conductor group 231, the second conductor group 132 is directly opposite to the fourth conductor group 232, and the other conductors included by the first conductive contact pad 13 are directly opposite to the other conductors included by the second conductive contact pad 23.

In an embodiment, the area of the first contact surface 14 is unequal to that of the second contact surface 24, that is, the area of the fusion surface of the first chip 10 is inconsistent with the area of the fusion surface of the second chip 20. When the area of the first contact surface 14 is smaller than that of the second contact surface 24, a part of the second contact surface 24 is opposite to the first substrate 11. Correspondingly, when the area of the first contact surface 14 is greater than that of the second contact surface 24, a part of the first contact surface 14 is opposite to the second substrate 21.

It should be noted that when the area of the first contact surface 14 is unequal to that of the second contact surface 24, for example, when the area of the first contact surface 14 is smaller than that of the second contact surface 24, the first conductor group 131 and the second conductor group 132 may occupy the whole first contact surface 14, and the third conductor group 231 and the fourth conductor group 232 may also occupy the whole second contact surface 24. At the moment, it should be ensured that the whole first conductor group 131 is directly opposite to the third conductor group 231 and the whole second conductor group 132 is directly opposite to the fourth conductor group 232. Moreover, the other part of at least one of the third conductor group 231 or the fourth conductor group 232 of the second conductive contact pad 23 may directly correspond to the first substrate 11. Correspondingly, when the area of the first contact surface 14 is greater than that of the second contact surface 24, reference may also be made to the embodiment, and details are not described herein.

In an embodiment, a circumferential outer edge of the first contact surface 14 includes at least one of a straight line or a curve, and a circumferential outer edge of the second contact surface 24 includes at least one of a straight line or a curve. A shape of the first contact surface 14 may be identical with or different from that of the second contact surface 24, and the shapes of the first contact surface 14 and the second contact surface 24 may be circular, elliptical, rectangular and the like, which is not limited herein.

It should be noted that, when the area of the first contact surface 14 is equal to that of the second contact surface 24, the first conductor group 131 and the second conductor group 132 occupy the whole first contact surface 14, and the third conductor group 231 and the fourth conductor group 232 occupy the whole second contact surface 24, it may be illustrated that the shape of the first contact surface 14 is identical with that of the second contact surface 24, and the first contact surface 14 exactly coincides with the second contact surface 24.

In an embodiment, a volume occupied by the first conductor group 131 in the first conductive contact pad 13 is greater than a volume occupied by the second conductor group 132 in the first conductive contact pad 13, and a volume occupied by the third conductor group 231 in the second conductive contact pad 23 is greater than a volume occupied by the fourth conductor group 232 in the second conductive contact pad 23. That is, proportions of low-melting point conductive materials of the first conductive contact pad 13 and the second conductive contact pad 23 are relatively low.

In an embodiment, an end of each first conductive connection wire 12 is connected to the first conductor group 131, and an end of each second conductive connection wire 22 is connected to the third conductor group 231. That is, the second conductor group 132 is only included on a side of the first conductive contact pad 13 away from the first conductive connection wire 12, and the fourth conductor group 232 is only included on a side of the second conductive contact pad 23 away from the second conductive connection wire 22.

It should be noted that an end of each first conductive connection wire 12 is connected to the first conductor group 131, and an end of each second conductive connection wire 22 is connected to the third conductor group 231. It may be further understood that, before the first chip 10 and the second chip 20 are bonded, an end of each first conductive connection wire 12 is connected to the first conductor group 131 and an end of each second conductive connection wire 22 is connected to the third conductor group 231. After the bonding structure is formed between the first conductive contact pad 13 and the second conductive contact pad 23, there may be a possibility of fusion between the conductive materials. However, a structure relationship may also be judged from material configuration.

In an embodiment, the second conductor group 132 includes a plurality of first sub-conductive sections 1321, and a part of the first conductor group 131 is clamped between adjacent first sub-conductive sections 1321. That is, it may be understood that a void is formed on a side of the first conductor group 131 away from the first conductive connection wire 12, so as to fill the first sub-conductive sections 1321.

In an embodiment, the fourth conductor group 232 includes a plurality of second sub-conductive sections 2321, and a part of the third conductor group 231 is clamped between adjacent second sub-conductive sections 2321. That is, it may be understood that a void is formed on a side of the third conductor group 231 away from the second conductive connection wire 22, so as to fill the second sub-conductive sections 2321.

Figure 3:
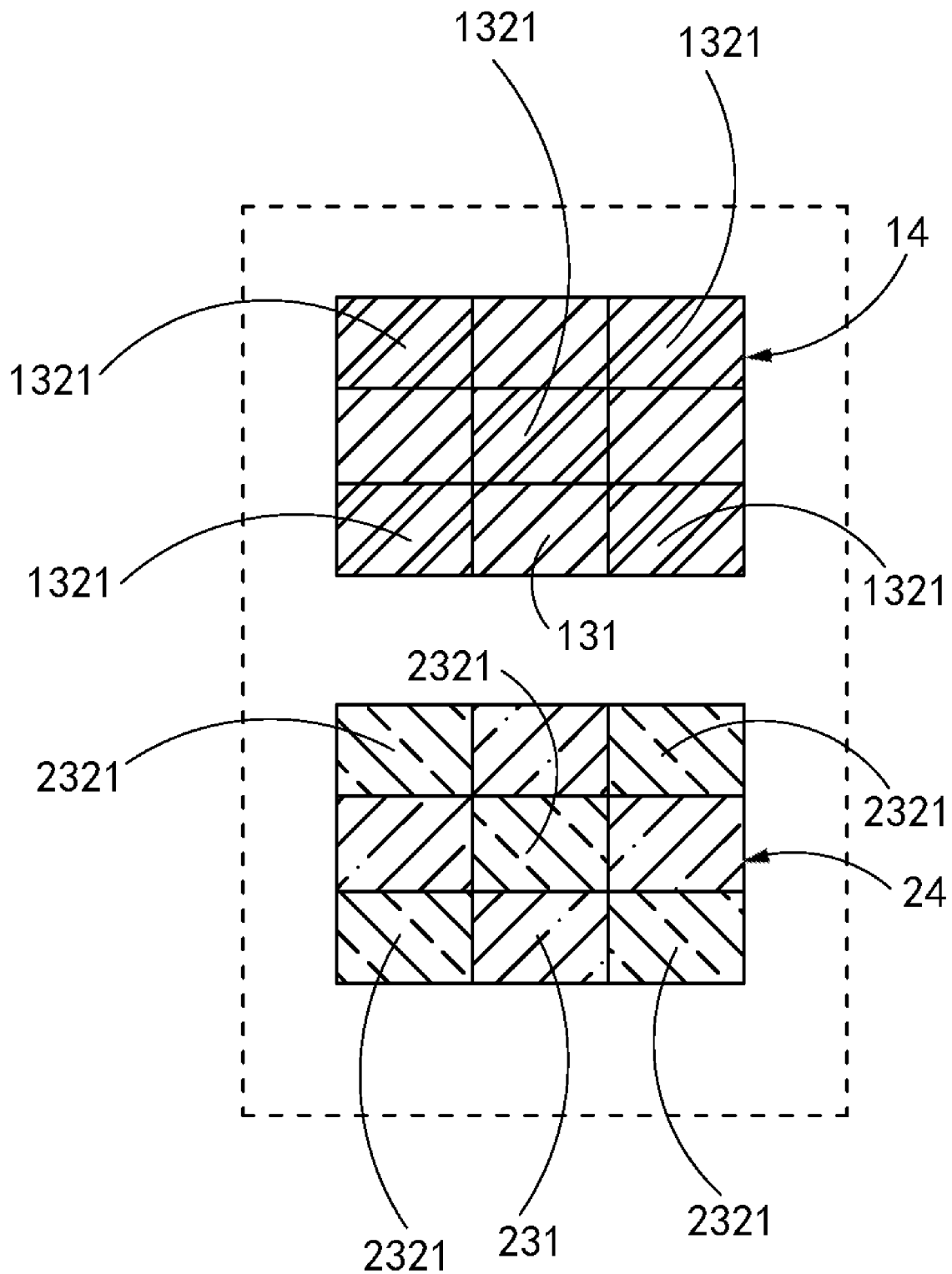
FIG. 3 is a schematic structural diagram of a first contact surface and a second contact surface of a semiconductor structure according to an exemplary implementation.

As shown in FIGS. 1 and 3, the area of the first contact surface 14 is equal to that of the second contact surface 24. The first conductor group 131 and the second conductor group 132 occupy the whole first contact surface 14, and the third conductor group 231 and the fourth conductor group 232 occupy the whole second contact surface 24. In addition, the area occupied by the first conductor group 131 on the first contact surface 14 is smaller than the area occupied by the second conductor group 132 on the first contact surface 14, and the area occupied by the third conductor group 231 on the second contact surface 24 is smaller than the area occupied by the fourth conductor group 232 on the second contact surface 24. In this way, it is ensured that the first conductor group 131 is directly opposite to the third conductor group 231, and the second conductor group 132 is directly opposite to the fourth conductor group 232. Moreover, the second conductor group 132 includes a plurality of first sub-conductive sections 1321, and the fourth conductor group 232 includes a plurality of second sub-conductive sections 2321.

Figure 4:
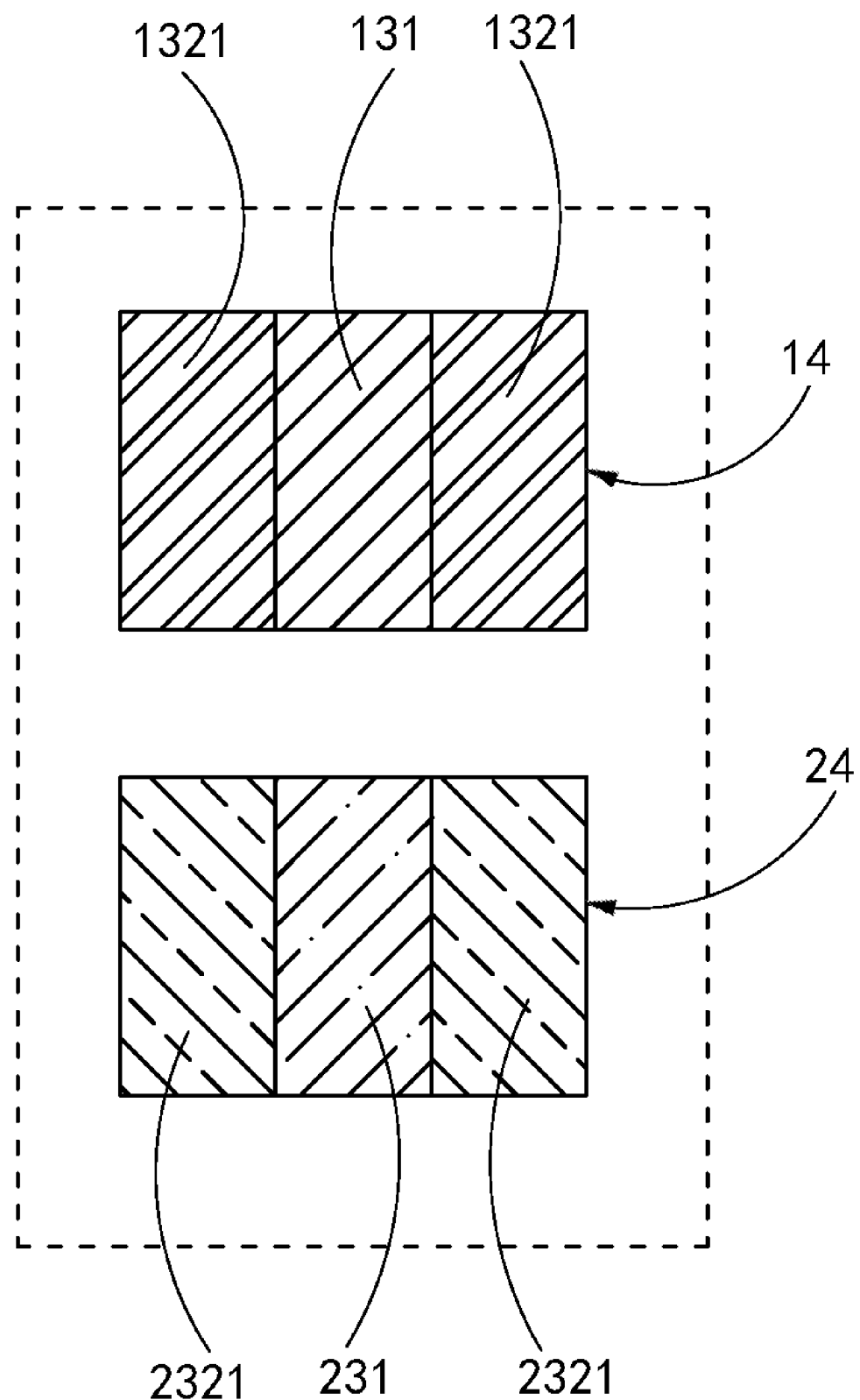
FIG. 4 is a schematic structural diagram of a first contact surface and a second contact surface of a semiconductor structure according to another exemplary implementation.

As shown in FIG. 4, the area of the first contact surface 14 is equal to that of the second contact surface 24. The first conductor group 131 and the second conductor group 132 occupy the whole first contact surface 14, and the third conductor group 231 and the fourth conductor group 232 occupy the whole second contact surface 24. In addition, the area occupied by the first conductor group 131 on the first contact surface 14 is smaller than the area occupied by the second conductor group 132 on the first contact surface 14, and the area occupied by the third conductor group 231 on the second contact surface 24 is smaller than the area occupied by the fourth conductor group 232 on the second contact surface 24. In this way, it is ensured that the first conductor group 131 is directly opposite to the third conductor group 231, and the second conductor group 132 is directly opposite to the fourth conductor group 232. Moreover, a part of the first conductor group 131 is clamped in two first sub-conductive sections 1321, and a part of the third conductor group 231 is clamped in two second sub-conductive sections 2321.

In an embodiment, a material of the first conductor group 131 is the same as a material of the third conductor group 231, the first conductor group 131 includes at least one of copper or tungsten, and the third conductor group 231 includes at least one of copper or tungsten. Certainly, in certain embodiments, it is not excluded that the material of the first conductor group 131 is different from the material of the third conductor group 231, but the melting point of the first conductor group is approximately the same as the melting point of the third conductor group.

In an embodiment, a material of the second conductor group 132 is the same as a material of the fourth conductor group 232, the first conductor group 131 includes at least one of copper or tungsten, and the second conductor group 132 includes at least one of bismuth, cadmium, tin, lead, dysprosium or indium. Certainly, in certain embodiments, it is not excluded that the material of the second conductor group 132 is different from the material of the fourth conductor group 232, but the melting point of the second conductor group is approximately the same as the melting point of the fourth conductor group.

It should be noted that the first conductor group 131 and the third conductor group 231 may only include single materials, for example, both the first conductor group 131 and the third conductor group 231 may be copper. Or, the first conductor group 131 and the third conductor group 231 may also be alloys, for example, copper-tungsten alloys. The second conductor group 132 and the fourth conductor group 232 may only include single materials, for example, both the second conductor group 132 and the fourth conductor group 232 may be tin. Or, the second conductor group 132 and the fourth conductor group 232 may also be alloys, for example, bismuth-tin, bismuth-lead, tin-indium and the like.

In an embodiment, the first conductor group 131 and the third conductor group 231 may be copper, and the second conductor group 132 and the fourth conductor group 232 may be tin. Due to a combination effect of low-melting point metal tin and a thermal expansion effect of metal copper, a copper surface is slightly indented to be smoothly fused with a low-melting point metal tin layer. During low-temperature (such as the first temperature) fusion, on upper and lower layers, tin (Sn) is directly opposite to each other, and copper (Cu) is directly opposite to each other. In the fusion process, tin is fused with nearby copper to form a $Cu_5Sn_6$ intermetallic compound (IMC). The upper and lower layers are made of a same material and opposite to each other, such that the intermetallic compound may be formed to improve the bonding strength, and resistance for slippage of stacked chips caused by external force or movement is provided to the stacked chips (especially alignment accuracy of chips on upper and lower layers). Therefore, benefit is brought to the bonding of the first conductive contact pad 13 and the second conductive contact pad 23 that undergo high-temperature (such as the second temperature) annealing afterwards, so as to improve the product yield.

According to the semiconductor structure of the present disclosure, upper and lower layers of low-melting point metal/alloys melted at a low temperature may be bonded firstly, and meanwhile, high-strength bonding of high-melting point metal (such as copper) and high-melting point metal (such as copper) may also be implemented.

Figure 5:
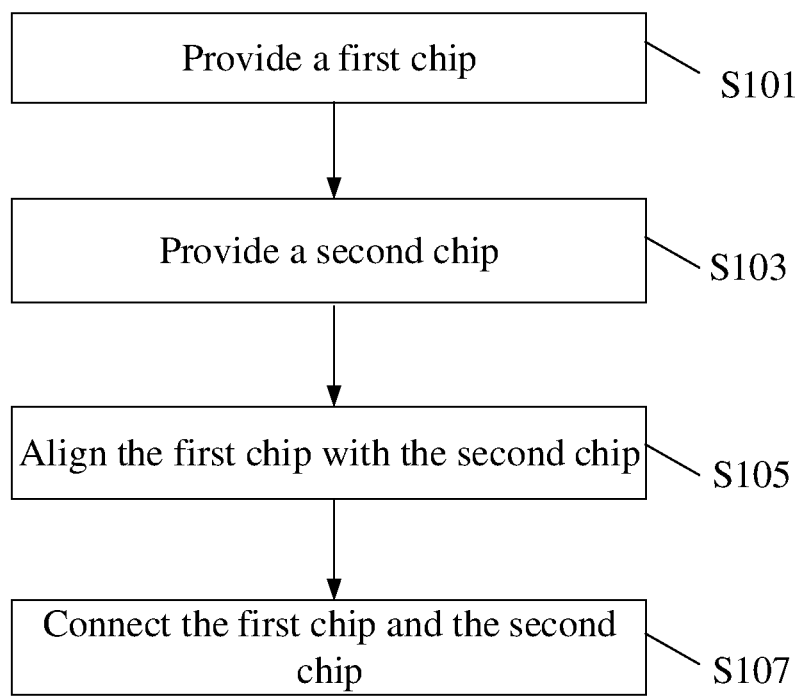
FIG. 5 is a schematic flowchart of a method of manufacturing a semiconductor structure according to an exemplary implementation.

An embodiment of the present disclosure further provides a method of manufacturing a semiconductor structure. With reference to FIG. 5, the method of manufacturing a semiconductor structure includes the following steps.

S101: Provide a first chip 10. The first chip 10 includes a first substrate 11, a first conductive connection wire 12 and a first conductive contact pad 13, the first conductive contact pad 13 is connected to the first conductive connection wire 12 and includes a first conductor group 131 and a second conductor group 132, and a melting point of the first conductor group 131 is higher than that of the second conductor group 132.

S103: Provide a second chip 20. The second chip 20 includes a second substrate 21, a second conductive connection wire 22 and a second conductive contact pad 23, the second conductive contact pad 23 is connected to the second conductive connection wire 22 and includes a third conductor group 231 and a fourth conductor group 232, and a melting point of the third conductor group 231 is higher than that of the fourth conductor group 232.

S105: Align the first chip 10 with the second chip 20. In this way, the first conductor group 131 is directly opposite to the third conductor group 231 and the second conductor group 132 is directly opposite to the fourth conductor group 232.

S107: Connect the first chip 10 and the second chip 20.

An end of the first conductive contact pad 13 facing toward the second conductive contact pad 23 is a first contact surface 14, an end of the second conductive contact pad 23 facing toward the first contact surface 14 is a second contact surface 24, an area occupied by the first conductor group 131 on the first contact surface 14 is smaller than an area occupied by the second conductor group 132 on the first contact surface 14, and an area occupied by the third conductor group 231 on the second contact surface 24 is smaller than an area occupied by the fourth conductor group 232 on the second contact surface 24.

According to the method of manufacturing a semiconductor structure according to the embodiment of the present disclosure, the first conductive connection wire 12 of the first chip 10 is connected to the first conductive contact pad 13, and the second conductive connection wire 22 of the second chip 20 is connected to the second conductive contact pad 23. In addition, the first conductive contact pad 13 includes the first conductor group 131 and the second conductor group 132, and the second conductive contact pad 23 includes the third conductor group 231 and the fourth conductor group 232. The first conductor group 131 is directly opposite to the third conductor group 231, and the second conductor group 132 is directly opposite to the fourth conductor group 232. Moreover, the melting point of the first conductor group 131 is higher than that of the second conductor group 132, and the melting point of the third conductor group 231 is higher than that of the fourth conductor group 232. Therefore, the second conductor group 132 and the fourth conductor group 232 may be melted and connected at a first temperature, that is, pre-connection of the first conductive contact pad 13 and the second conductive contact pad 23 is implemented. Then, the first chip 10 and the second chip 20 that are pre-connected are transferred to an annealing condition at a second temperature for bonding, so as to implement reliable bonding of the first conductive contact pad 13 and the second conductive contact pad 23. Before the transfer, the first chip 10 and the second chip 20 have been pre-connected, such that the first chip 10 and the second chip 20 will not move relatively, thereby ensuring reliable alignment of the first chip 10 and the second chip 20, and improving the performance of the semiconductor structure.

In an embodiment, S107 of connecting the first chip 10 and the second chip 20 includes: melt the second conductor group 132 and the fourth conductor group 232 at the first temperature, so as to ensure that the first chip 10 is connected to the second chip 20. The first temperature is lower than the melting points of the first conductor group 131 and the third conductor group 231, that is, at the first temperature, the second conductor group 132 and the fourth conductor group 232 are melted, while the first conductor group 131 and the third conductor group 231 are not melted. At the moment, conductive materials of the first conductive contact pad 13 and the second conductive contact pad 23 may be interpenetrated and fused at an interface to form a pre-bonding structure.

In an embodiment, S107 of connecting the first chip 10 and the second chip 20 further includes: bond the connected first chip 10 and the connected second chip 20 under an annealing condition at a second temperature, such that a bonding structure is formed after the first conductive contact pad 13 and the second conductive contact pad 23 are melted, where the first temperature is lower than the second temperature. The first conductive contact pad 13 and the second conductive contact pad 23 form the pre-bonding structure at the first temperature, so as to move to an environment at the second temperature for bonding. Therefore, the first chip 10 and the second chip 20 may be prevented from relative slippage, thereby improving the yield of the semiconductor structure.

It should be noted that a specific process of bonding the first chip 10 and the second chip 20 under the annealing condition at the second temperature is not limited, and reference may be made to a bonding manner in the related art. It is focused herein that the first chip 10 and the second chip 20 have been pre-connected before the bonding under the annealing condition at the second temperature.

In an embodiment, the second conductor group 132 is formed on the first conductor group 131 through electroplating or printing; and the fourth conductor group 232 is formed on the third conductor group 231 through electroplating or printing.

It should be noted that, in an embodiment, the method of manufacturing a semiconductor structure is used to form the semiconductor structure. Reference may be made to specific description of the semiconductor structure for materials and structures of the first chip 10 and the second chip 20 involved in the method of manufacturing a semiconductor structure, and details are not described herein.

Those skilled in the art may easily figure out other implementations of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A semiconductor structure, comprising:
 a first chip, wherein the first chip comprises a first substrate, a first conductive connection wire and a first conductive contact pad, the first conductive contact pad is connected to the first conductive connection wire, the first conductive contact pad comprises a first conductor group and a second conductor group, and a melting point of the first conductor group is higher than a melting point of the second conductor group; and a second chip, wherein the second chip comprises a second substrate, a second conductive connection wire and a second conductive contact pad, the second conductive contact pad is connected to the second conductive connection wire, the second conductive contact pad comprises a third conductor group and a fourth conductor group, a melting point of the third conductor group is higher than a melting point of the fourth conductor group, the first conductor group is directly opposite to the third conductor group, and the second conductor group is directly opposite to the fourth conductor group, such that a bonding structure is formed between the first conductive contact pad and the second conductive contact pad;

wherein, an end of the first conductive contact pad facing toward the second conductive contact pad is a first contact surface, an end of the second conductive contact pad facing toward the first contact surface is a second contact surface, an area occupied by the first conductor group on the first contact surface is smaller than an area occupied by the second conductor group on the first contact surface, and an area occupied by the third conductor group on the second contact surface is smaller than an area occupied by the fourth conductor group on the second contact surface;

wherein, a coefficient of expansion of the second conductor group is lower than a coefficient of expansion of the first conductor group, and a coefficient of expansion of the fourth conductor group is lower than a coefficient of expansion of the third conductor group.

2. The semiconductor structure according to claim 1, wherein the first conductor group and the second conductor group occupy an entirety of the first contact surface, and the third conductor group and the fourth conductor group occupy an entirety of the second contact surface.

3. The semiconductor structure according to claim 2, wherein the first conductor group comprises only a first conductor, and the second conductor group comprises only a second conductor; and the third conductor group comprises only a third conductor, and the fourth conductor group comprises only a fourth conductor.

4. The semiconductor structure according to claim 3, wherein an area of the first contact surface is equal to an area of the second contact surface;

wherein the area occupied by the first conductor group on the first contact surface is equal to the area occupied by the third conductor group on the second contact surface.

5. The semiconductor structure according to claim 3, wherein an area of the first contact surface is unequal to an area of the second contact surface.

6. The semiconductor structure according to claim 2, wherein a circumferential outer edge of the first contact surface comprises at least one of a straight line or a curve, and a circumferential outer edge of the second contact surface comprises at least one of a second straight line or a second curve.

7. The semiconductor structure according to claim 1, wherein a volume occupied by the first conductor group in the first conductive contact pad is greater than a volume occupied by the second conductor group in the first conductive contact pad; and a volume occupied by the third conductor group in the second conductive contact pad is greater than a volume occupied by the fourth conductor group in the second conductive contact pad.

8. The semiconductor structure according to claim 7, wherein one end of the first conductive connection wire is completely connected on the first conductor group; and one end of the second conductive connection wire is completely connected on the third conductor group.

9. The semiconductor structure according to claim 8, wherein at least one of:

the second conductor group comprises a plurality of first sub-conductive sections, and a part of the first conductor group is clamped between adjacent first sub-conductive sections of the plurality of first sub-conductive sections; or the fourth conductor group comprises a plurality of second sub-conductive sections, and a part of the third conductor group is clamped between adjacent second sub-conductive sections of the plurality of second sub-conductive sections.

10. The semiconductor structure according to claim 7, wherein the first conductor group comprises at least one of copper or tungsten, and the second conductor group comprises at least one of bismuth, cadmium, tin, lead, dysprosium or indium; and the third conductor group comprises at least one of copper or tungsten, and the fourth conductor group comprises at least one of bismuth, cadmium, tin, lead, dysprosium or indium.

11. The semiconductor structure according to claim 1, wherein the first conductive connection wire is a first through-silicon via; and the second conductive connection wire is a second through-silicon via.

12. The semiconductor structure according to claim 1, wherein both the first conductive connection wire and the first conductive contact pad are located in the first substrate.

13. The semiconductor structure according to claim 1, wherein both the second conductive connection wire and the second conductive contact pad are located in the second substrate.

14. The semiconductor structure according to claim 1, wherein a material of the first conductor group is the same as a material of the third conductor group.

15. The semiconductor structure according to claim 1, wherein a material of the second conductor group is the same as a material of the fourth conductor group.

16. The semiconductor structure according to claim 1, wherein a thickness of the second conductor group is less than 1 μm, and a thickness of the fourth conductor group is less than 1 μm.

17. A method of manufacturing a semiconductor structure, comprising:

providing a first chip, wherein the first chip comprises a first substrate, a first conductive connection wire and a first conductive contact pad, the first conductive contact pad is connected to the first conductive connection wire, the first conductive contact pad comprises a first conductor group and a second conductor group, and a melting point of the first conductor group is higher than a melting point of the second conductor group;

providing a second chip, wherein the second chip comprises a second substrate, a second conductive connection wire and a second conductive contact pad, the second conductive contact pad is connected to the second conductive connection wire, the second conductive contact pad comprises a third conductor group and a fourth conductor group, and a melting point of the third conductor group is higher than a melting point of the fourth conductor group;

aligning the first chip with the second chip, such that the first conductor group is directly opposite to the third conductor group, and the second conductor group is directly opposite to the fourth conductor group, wherein a coefficient of expansion of the second conductor group is lower than a coefficient of expansion of the first conductor group, and a coefficient of expansion of the fourth conductor group is lower than a coefficient of expansion of the third conductor group; and connecting the first chip and the second chip;

wherein, an end of the first conductive contact pad facing toward the second conductive contact pad is a first contact surface, an end of the second conductive contact pad facing toward the first contact surface is a second contact surface, an area occupied by the first conductor group on the first contact surface is smaller than an area occupied by the second conductor group on the first contact surface, and an area occupied by the third conductor group on the second contact surface is smaller than an area occupied by the fourth conductor group on the second contact surface.

18. The method of manufacturing a semiconductor structure according to claim 17, wherein the connecting the first chip and the second chip comprises:
melting the second conductor group and the fourth conductor group at a first temperature, such that the first chip is connected to the second chip;
wherein the first temperature is lower than the melting point of the first conductor group and the melting point of the third conductor group.

19. The method of manufacturing a semiconductor structure according to claim 18, wherein the connecting the first chip and the second chip further comprises:
bonding the first chip and the second chip under an annealing condition at a second temperature after the melting the second conductor group and the fourth conductor group at a first temperature, such that a bonding structure is formed between the first conductive contact pad and the second conductive contact pad;
wherein the first temperature is lower than the second temperature.

20. The method of manufacturing a semiconductor structure according to claim 17, wherein the second conductor group is formed on the first conductor group through electroplating or printing, and
the fourth conductor group is formed on the third conductor group through electroplating or printing.

* * * * *